(12) United States Patent
Albrecht et al.

(10) Patent No.: US 7,532,067 B2
(45) Date of Patent: May 12, 2009

(54) AMPLIFIER DEVICE WITH ADJUSTABLE SUPPLY VOLTAGE

(75) Inventors: Adam Albrecht, Nürnberg (DE); Horst Kroeckel, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/862,303

(22) Filed: Sep. 27, 2007

(65) Prior Publication Data

US 2008/0079488 A1 Apr. 3, 2008

(30) Foreign Application Priority Data

Sep. 29, 2006 (DE) .................. 10 2006 046 288

(51) Int. Cl.
*H03G 3/00* (2006.01)
(52) U.S. Cl. .................. 330/127; 330/140; 330/297
(58) Field of Classification Search ............. 330/127, 330/129, 140, 279, 297
See application file for complete search history.

(56) References Cited

U.S. PATENT DOCUMENTS 6,369,651 B1 * 4/2002 Dent .................... 330/127
6,373,335 B1 * 4/2002 Carver .................. 330/297

FOREIGN PATENT DOCUMENTS

DE 35 34 930 A1 4/1987
DE 198 12 069 A1 9/1999

* cited by examiner

*Primary Examiner*—Khanh V Nguyen
(74) *Attorney, Agent, or Firm*—Schiff Hardin LLP

(57) ABSTRACT

A radio-frequency power amplifier is supplied by a voltage supply device. The voltage supply device has a voltage divider chain that is connected at the input side with a base potential and a ground voltage. The voltage divider chain has a number of Zener diodes connected in series, with which at least one capacitor is connected in parallel. Intermediate voltages that lie between the ground voltage and the base potential can be tapped at respective node points between each two immediately adjacent Zener diodes. A first supply input of the radio-frequency power amplifier is connected with the ground voltage. The voltage divider chain is connected with the radio-frequency power amplifier via a switching device. The switching device has a number of switching elements connected in parallel with one another, these switching elements being connected at the output side with a second supply input of the radio-frequency power amplifier. The base potential or one of the intermediate voltages is present at the input side of each switching element. The switching elements can be individually controlled by a control device, such that the second supply input can be selectively connected with the base potential and each of the intermediate voltages via the switching device.

7 Claims, 1 Drawing Sheet

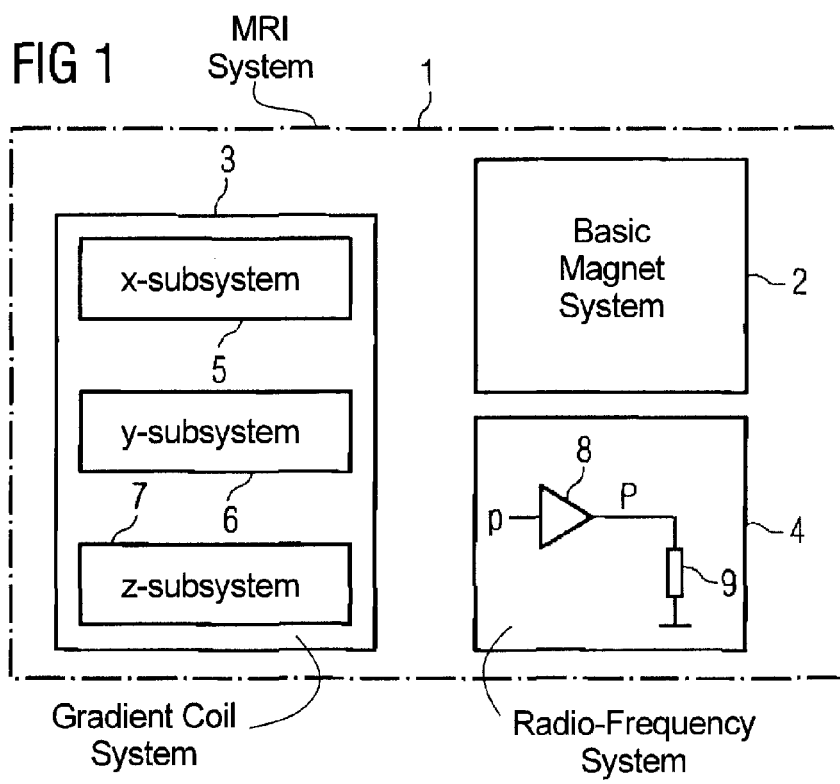
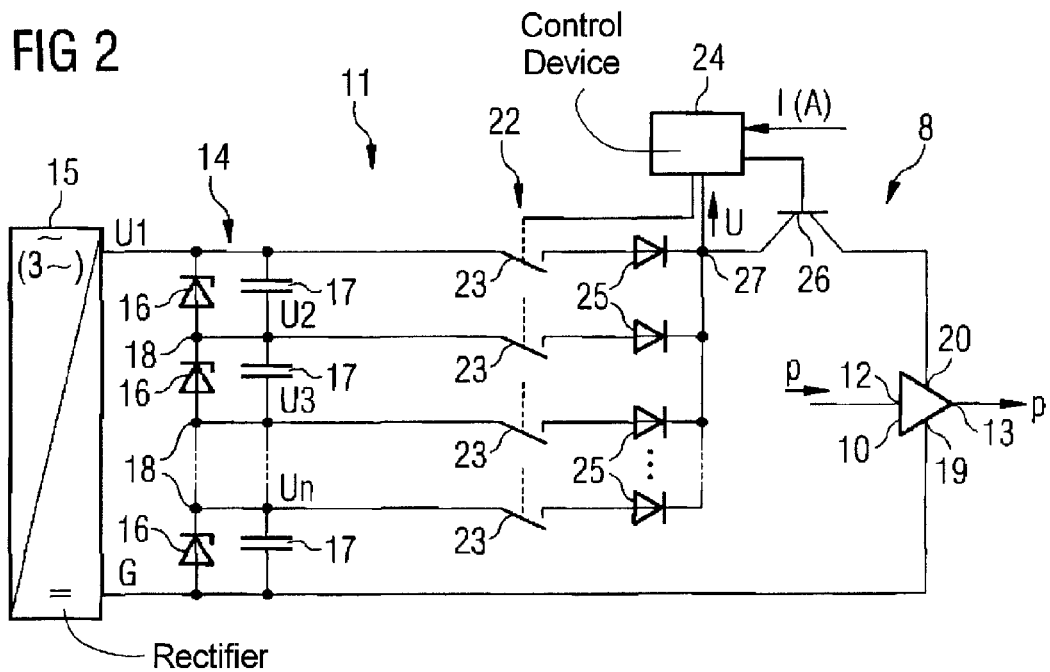

AMPLIFIER DEVICE WITH ADJUSTABLE SUPPLY VOLTAGE

BACKGROUND OF THE INVENTION

1. Field of the Invention

The present invention concerns an amplifier device of the type having a radio-frequency power amplifier and a voltage supply device for the radio-frequency power amplifier.

2. Description of the Prior Art

Amplifier devices of the above type are generally known and are used for a wide variety of applications. One possible application is the supply of an RF transmission coil of a magnetic resonance system with electrical energy.

In medical uses of magnetic resonance systems, the transmission coils must be supplied with pulsed currents over a large dynamic range. The current pulses exhibit essentially the same energies among one another, but exhibit power requirements significantly deviating from one another. This has the result that the radio-frequency power amplifier must emit pulses of long duration in the lower power range in which the radio-frequency power amplifier exhibits a poorer degree of efficiency. This is a disadvantage with regard to the power loss that occurs in the radio-frequency power amplifier. The requirements for reliability of the radio-frequency power amplifier and the cost-effectiveness of the operation require the radio-frequency power amplifier to be operated efficiently in the entire dynamic range.

One possibility to achieve a better efficiency is to dynamically optimize the supply voltage of the end stage of the radio-frequency power amplifier with regard to the currently required output power. This solution delivers a nearly perfect result when only the radio-frequency power amplifier is considered, but it normally leads to substantially increased power losses in the voltage supply device for the radio-frequency power amplifier.

In medical uses of magnetic resonance systems, the radio-frequency antenna is operated in a pulsed power mode in which it requires a significant maximum current at its highest operating point. This current requirement limits the possibility to use a high-efficiency switched voltage supply. Furthermore, a large capacitance battery is required in order to store the required charge. The charge is typically stored by a number of capacitors connected in parallel that are dimensioned for the maximum voltage of the radio-frequency power amplifier. The maximum voltage is calculated as the minimum voltage that is required in order to correctly operate the radio-frequency power amplifier plus the voltage decrease due to the capacitor discharge when radio-frequency pulses are required. In practical embodiments this means that the capacitors must be designed for very high voltages and must be able to store a large charge. They therefore require a large installation space.

A device for dimming internal monitoring lights of military vehicles is known from DE 35 34 930 A1. In this device an electrical monitoring light circuit arrangement with at least one Zener diode and a relay connected in parallel with the Zener diode is used. The circuit arrangement is electrically connected with a hooded light switch such that, given an activated ignition of the vehicle and given switching to "hooded light off", the relay coil changes to or draws a predetermined maximum level upon bridging of the associated Zener diode for the purpose of dimming the monitoring lights.

A power amplifier with at least two end stages connected in series at the output side is known from DE 198 12 069 A1, wherein each of the end stages has a power bridging circuit in order to generate an end stage voltage at each stage by pulse width modulation according to an end stage switching clock. The output voltage of the power amplifier is a combination of the end stage voltages. The end stage switching clocks of the end stages are offset from one another in order to increase the effective switching frequency of the output voltage.

SUMMARY OF THE INVENTION

An object of the present invention is to provide an amplifier device of the aforementioned type that can be produced more cost-effectively and that can be operated more efficiently, and that in particular exhibits only a relatively slight power loss.

The object is achieved by an amplifier device according to the invention wherein the voltage supply device has a voltage divider chain that is connected at the input side with a ground voltage and a base potential. The voltage divider chain is formed by a number of Zener diodes connected in series, with which at least one capacitor is connected in parallel. Intermediate voltages that lie between the base voltage and the ground potential can be tapped at respective node points between each two immediately adjacent Zener diodes. A first supply input of the radio-frequency power amplifier is connected with the base potential. The voltage divider chain is connected with the radio-frequency power amplifier via a switching device. The switching device has a number of switching elements connected in parallel with one another that are connected at the output side with a second supply input of the radio-frequency power amplifier. The ground voltage or one of the intermediate voltages is present at the input side at each switching element. The switching elements are individually controlled by a control device, so that the second supply input can be selectively connected with the ground voltage and each of the intermediate voltages via the switching device.

It is possible for the switching elements to be designed for switching the ground voltage and, in the unconnected (open) state, prevent a reaction to the voltage (ground voltage or one of the intermediate voltages) switched by them. If this is not the case (or possibly as a precautionary measure), a diode polarized in the conducting direction can be connected in series with each of the switching elements. Such a diode can also be provided for the switching element that switches the ground voltage.

Information defining an output signal that is to be output from the radio-frequency power amplifier can be supplied to the control device. In this case the control device is preferably fashioned to determine which of the switching elements will be connected dependent on the information about the output signal, and the control device activates the appropriate switching element or elements.

A voltage tap from which a measurement signal can be fed to the control device can be arranged before (upstream from) the switching device. In this case the control device is preferably fashioned to determine which of the switching elements will be switched dependent on the measurement signal, and the control device activates the appropriate switch element or elements.

The switching elements may be switched at high frequency, but can alternatively be switched only at low frequency.

BRIEF DESCRIPTION OF THE DRAWINGS

FIG. 1 schematically illustrates a magnetic resonance system with a radio-frequency system.

FIG. 2 is a circuit diagram of an embodiment of an amplifier device in accordance with the invention.

DESCRIPTION OF THE PREFERRED EMBODIMENTS

According to FIG. 1, a magnetic resonance imaging (MRI) system 1 has various systems 2, 3, 4, in particular a basic magnet system 2, a gradient coil system 3 and a radio-frequency system 4. The gradient magnet system 3 normally includes three subsystems 5, 6, 7, respectively one subsystem 5, 6, 7 for the three axes of a Cartesian coordinate system. The subsystems 5, 6, 7 are normally designed identically.

The basic magnetic system 2 and the gradient magnet system 3 are of subordinate importance in the framework of the present invention and need not be explained in detail. Only the radio-frequency system 4 is subsequently explained in detail.

In the course of the acquisition of a raw data sequence in the magnetic resonance system, a low-energy pulse p is supplied to an amplification device 8 of the radio-frequency system 4 at specific points in time. Each low-energy pulse p exhibits a predetermined time curve that can be different from pulse p-to-pulse p. A longer pulse pause lies between every two low-energy pulses p. The amplifier device 8 amplifies the low-energy pulse p fed to it and thus generates a corresponding power pulse P. The amplifier device 8 feeds the power pulse P to an RF transmission coil 9 and thus supplies it with electrical energy. Embodiments of the amplifier device 8 is the primary subject matter of the present invention, as subsequently explained in detail in connection with FIG. 2.

According to FIG. 2, the amplifier device 8 has a radio-frequency power amplifier 10 and a voltage supply device 11 for the radio-frequency power amplifier 10. The low-energy pulse p is fed to a signal input 12 of the radio-frequency power amplifier 10. The radio-frequency power amplifier 10 amplifies the low-energy pulse p so that it is output to a signal output 13 of the radio-frequency power amplifier 10 as a power pulse P and is fed to the RF transmission coil 9.

The voltage supply device 11 has a voltage divider chain 14. The voltage divider chain 14 is connected at the input side with a base potential U1 and a ground voltage G. For example, a rectifier 15 that is fed from the typical public power grid (one-phase or three-phase) and rectifies, smoothes and outputs the mains voltage therefrom can be arranged upstream from the voltage supply device 11 for generation of the base potential U1 and the ground voltage G.

The voltage divider chain 14 is formed by a number of Zener diodes 16 that are connected in series. The number of Zener diodes can in principle be freely selected if and when it is greater than 1. Usually the number is greater than 2, and normally lies between 5 and 25. The Zener voltages of the Zener diodes 16 are selected such that the sum of the Zener voltages of the Zener diodes 16 is slightly greater than the base potential U1. The Zener voltages can in particular be selected such that the sum of the Zener voltages is greater than the base voltage U1 only when the Zener voltages of all Zener diodes 16 are added to the voltage divider chain 14.

Capacitors 17 are connected in parallel with the Zener diodes 16. At least one capacitor 17 is connected in parallel with each Zener diode 16. A number of capacitors 17 can also respectively be connected in parallel with the Zener diodes 16. The capacitors 17 are designed such that their voltage strength is greater than the Zener voltage of the respective Zener diode 16 connected in parallel therewith.

Due to the Zener diodes 16, intermediate voltages U2, U3, ... Un can be tapped at node points 18 that are arranged between every two immediately adjacent Zener diodes 16. Each intermediate voltage U2, U3, ... Un lies between the base potential U1 and the ground voltage G.

A first supply input 19 of two supply inputs 19, 20 of the radio-frequency power amplifier 10 can be connected with the ground voltage G. According to FIG. 2, the first supply input 19 is permanently connected to the ground voltage G.

The voltage divider chain 14 is connected via a switching device 22 with the radio-frequency power amplifier 10. The switching device 22 has a number of switching elements 23 that are connected in parallel with one another. The switching elements 23 are connected at the output side with the second supply input 20 of the radio-frequency power amplifier 10. Either the base potential U1 or one of the intermediate voltages U2, U3, ... is present at the input side at the switching elements 23. The switching elements 23 preferably are semiconductor switching elements, in particular transistors. Suitable transistors are, for example, bipolar transistors and MOS transistors.

The voltage supply device 11 has a control device 24. The switching elements 23 can be individually controlled by the control device 24. The second supply input 20 can be selectively charged with the base potential U1 and each of the intermediate voltages U2, U3, ... Un via the switching device 22.

The voltage elements 23 can be designed in various ways. For example, it is possible for the switching elements 23 to be fashioned to be voltage-stable. The term "voltage-stable" means that reactions to the voltages U1, U2, ... Un switched by the respective switching element 23 do not occur, independent of whether the respective switching element 23 is switched or not. In this case diodes 25 can (but do not have to) be connected in series with the switching elements 23 at which one of the intermediate voltages U2, U3, ... Un is present, with the diodes 25 being polarized in the conducting direction. Such a diode 25 can also possibly be present at the switching element 23 at which the base potential U1 is present.

Alternatively, it is possible for the switching elements 23 (in the switched or un-switched state) not to be voltage-stable. In this case the diodes 25 must be present at least given the switching elements 23 which switch the intermediate voltages U2, U3, ... Un.

Furthermore, it is possible for the switching elements 23 to be switched at high frequency. However, the switching elements 23 of the switching device 22 can advantageously be switched only at low frequency (meaning distinctly below the limit frequency of the radio-frequency power amplifier 10 in the frequency range).

An analog voltage regulator 26 is arranged downstream from the switching device 22. The second supply input 20 is connected with the switching device 22 via the voltage regulator 26.

In the operation of the amplifier device 8, information I about an output signal A that should be output from the radio-frequency power amplifier 10 is fed to the control device 24. The output signal A corresponds to one of the power pulses P. The information is fed to the control device 24 in a timely manner before the beginning of the respective power pulse P.

If the power pulses P to be output are previously known, it can suffice to merely feed a corresponding identification (for example the number of the respective power pulse P) to the control device 24 as information. Alternatively, it is possible to feed a description of the respective power pulse P to the control device 24 as information I in a predetermined form.

The control device 24 is fashioned such that it decides which of the switching elements 23 of the switching device 22 it switches dependent on the information I about the output signal A that is supplied to it. The control device 24 outputs a corresponding control signal to the appertaining switching element 23. Furthermore, it controls the voltage regulator 26.

It is possible for the switch state of the switching device 22 (i.e., which of the switching elements 23 is activated) that is determined once to be maintained during the respective power pulse P. It is preferable, however, for a voltage tap 27 to be arranged downstream from the switching device 22. The voltage tap 27 should be arranged between the switching device 22 and the voltage regulator 26.

The voltage tap 27 delivers a measurement signal U that can be fed to the control device 24. In this case the control device 24 is fashioned such that, dependent on the supplied measurement signal U, it continually checks whether the voltage emitted from the switching device 22 is too large or too small. The control device 24 possibly activates another of the switching elements 23 (even during the output of a power pulse P), in particular a switching element 23 that is immediately adjacent to the currently activated switching element 23. In this case the control device 24 thus decides, dependent on the acquired measurement signal U, which of the switching elements 23 it switches and correspondingly controls the appertaining switching element 23.

When the diodes 25 are present, a simultaneous activation of a plurality of switching elements 23 is possible at any time. When the diodes 25 are not present, the switching elements 23 do not have to be voltage-stable, or the connection of one of the switching elements 23 must be coordinated with the disconnection of another of the switching elements 23. In this case a switching over is only possible when the switching elements 23 can be switched fast enough.

The loss power of the amplifier device 8 can be minimized in a simple, cost-effective and highly effective manner by means of the inventive amplifier device 8.

Although modifications and changes may be suggested by those skilled in the art, it is the intention of the inventors to embody within the patent warranted hereon all changes and modifications as reasonably and properly come within the scope of their contribution to the art.

We claim as our invention:

1. An amplifier device comprising:
   a radio frequency power amplifier;
   a voltage supply device that supplies an operating voltage for the radio frequency power amplifier;
   said voltage supply device comprising a voltage divider chain having an input side connected to ground and to a base potential;
   said voltage divider chain comprising a plurality of Zener diodes connected in series and at least one capacitor connected in parallel with the series-connected Zener diodes, adjacent series-connected Zener diodes having a node therebetween and, at each node, a voltage tap allowing an intermediate voltage to be tapped between the adjacent Zener diodes;
   said radio frequency power amplifier having a first supply input connected to said base potential;
   a switching device connected between said voltage divider chain and said radio frequency power amplifier, said switching device comprising a plurality of switching elements connected in parallel, said switching elements being connected at an output side with a second supply input of the radio frequency power amplifier, the switching elements being respectively connected at an input side to ground or one of said intermediate voltages; and
   a control device that individually controls said switching elements to open and close the respective switching elements to cause the second supply input to be selectively connected to any of ground or said intermediate voltages by respective switching devices.

2. An amplifier device as claimed in claim 1 comprising a plurality of diodes, each polarized in a conducting direction, respectively connected in series with the switching elements.

3. An amplifier device as claimed in claim 1 wherein said control device has an input supplied with information describing an output signal that is to be generated at an output of the radio frequency power amplifier, and wherein said control device, based on said information, determines which of said switching elements should be open and closed to cause said output signal to occur at the output of the radio frequency power amplifier.

4. An amplifier device as claimed in claim 1 comprising a voltage tap downstream from said switching device at which a measurement signal is present, and wherein said control device has an input that receives said measurement signal and wherein said control device, based on said measurement signal, determines which of said switching elements should be opened and closed.

5. An amplifier device as claimed in claim 1 comprising an analog voltage regulator connected between the switching elements connected in parallel with each other and said second supply input.

6. An amplifier device as claimed in claim 1 wherein said switching elements are switchable only at a low frequency.

7. An amplifier device as claimed in claim 1 wherein said radio frequency power amplifier has an output connected to a radio frequency transmission coil of a magnetic resonance system.

* * * * *